(12) United States Patent
Sung

(10) Patent No.: US 10,643,973 B2
(45) Date of Patent: May 5, 2020

(54) SEMICONDUCTOR PACKAGES INCLUDING A MULTI-CHIP STACK

(71) Applicant: SK hynix Inc., Icheon-si, Gyeonggi-do (KR)

(72) Inventor: Ki Jun Sung, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/140,229

(22) Filed: Sep. 24, 2018

(65) Prior Publication Data

US 2019/0221543 A1  Jul. 18, 2019

(30) Foreign Application Priority Data

Jan. 18, 2018 (KR) .................. 10-2018-0006508

(51) Int. Cl.
| | |
|---|---|
| *H01L 23/48* | (2006.01) |
| *H01L 25/065* | (2006.01) |
| *H01L 23/29* | (2006.01) |
| *H01L 23/522* | (2006.01) |
| *H01L 23/00* | (2006.01) |
| *H01L 23/498* | (2006.01) |
| *H01L 23/31* | (2006.01) |
| *H01L 21/56* | (2006.01) |

(52) U.S. Cl.
CPC .......... *H01L 25/0652* (2013.01); *H01L 23/29* (2013.01); *H01L 23/49822* (2013.01); *H01L 23/5226* (2013.01); *H01L 24/09* (2013.01); *H01L 24/17* (2013.01); *H01L 25/0657* (2013.01); *H01L 21/561* (2013.01); *H01L 23/3128* (2013.01); *H01L 2225/06524* (2013.01); *H01L 2225/06527* (2013.01); *H01L 2225/06562* (2013.01); *H01L 2225/06575* (2013.01)

(58) Field of Classification Search
CPC ................. H01L 25/0652; H01L 23/29; H01L 23/49822; H01L 23/5226
See application file for complete search history.

(56) References Cited

U.S. PATENT DOCUMENTS

| | | | |
|---|---|---|---|
| 9,147,711 B1 * | 9/2015 | Azuma | ............. H01L 27/14618 |
| 2015/0187705 A1 * | 7/2015 | Chung | .................. H01L 23/552 257/659 |
| 2017/0141092 A1 * | 5/2017 | Kim | ........................ H01L 25/18 |
| 2018/0114776 A1 * | 4/2018 | Han | ........................ H01L 24/49 |
| 2018/0122789 A1 * | 5/2018 | Kang | ...................... H01L 24/20 |

FOREIGN PATENT DOCUMENTS

| | | |
|---|---|---|
| KR | 1020090055316 A | 6/2009 |
| KR | 1020150045843 A | 4/2015 |
| KR | 101579666 B1 | 12/2015 |

* cited by examiner

*Primary Examiner* — Phuc T Dang
(74) *Attorney, Agent, or Firm* — William Park & Associates Ltd.

(57) ABSTRACT

Semiconductor packages are provided. The semiconductor package includes a first semiconductor chip to which a first elevated pillar bump is connected, a second semiconductor chip stacked on the first semiconductor chip to leave revealed the first elevated pillar bump and configured to include a first chip pad disposed on a center region of the second semiconductor chip, a third semiconductor chip offset and stacked on the second semiconductor chip to leave revealed the first chip pad, and a chip supporter supporting an overhang of the third semiconductor chip.

20 Claims, 11 Drawing Sheets

SEMICONDUCTOR PACKAGES INCLUDING A MULTI-CHIP STACK

CROSS-REFERENCE TO RELATED APPLICATIONS

The present application claims priority under 35 U.S.C. 119(a) to Korean Application No. 10-2018-0006508, filed on Jan. 18, 2018, which is incorporated herein by reference in its entirety.

BACKGROUND

1. Technical Field

The present disclosure relates to semiconductor package technologies and, more particularly, to semiconductor packages including a multi-chip stack and methods of fabricating the same.

2. Related Art

Recently, semiconductor packages having a high density and a high performance have been required in various electronic systems. In addition, the semiconductor packages have been developed to have a relatively small form factor because mobile systems require compact semiconductor packages. A flip chip stack technique may be attractive as a package technique for realizing high performance semiconductor packages. A general flip chip stack technique has been proposed to provide a dual-die stack structure including a couple of chips or a couple of dies which are stacked on a substrate. Accordingly, it may be necessary to develop a package technique for increasing the number of semiconductor chips embedded in the package without increasing a thickness of the package.

SUMMARY

According to an embodiment, there is provided a semiconductor package. The semiconductor package includes a first semiconductor chip to which a first elevated pillar bump is connected and a second semiconductor chip stacked on the first semiconductor chip to leave revealed the first elevated pillar bump and configured to include a first chip pad disposed in a center region of the second semiconductor chip. The center region of the second semiconductor chip is spaced apart from an edge region of the second semiconductor chip. A third semiconductor chip is stacked on the second semiconductor chip to be laterally offset from the second semiconductor chip to leave revealed the first chip pad. The third semiconductor chip includes an overhang laterally protruding further than a side surface of the second semiconductor chip. A chip supporter is provided to support the overhang of the third semiconductor chip. An encapsulation layer is disposed to encapsulate a stack structure of the first, second, and third semiconductor chips. Circuit interconnection patterns are disposed on the encapsulation layer and electrically connected to the first elevated pillar bump and the first chip pad.

According to another embodiment, there is provided a semiconductor package. The semiconductor package includes a first semiconductor chip to which a first elevated pillar bump is connected, a second semiconductor chip stacked on the first semiconductor chip to leave revealed the first elevated pillar bump and configured to include a first chip pad, an encapsulation layer encapsulating a stack structure of the first and second semiconductor chips, opening holes substantially penetrating the encapsulation layer to expose the first elevated pillar bump and the first chip pad, and circuit interconnection patterns configured to include via portions and extension portions. The via portions are connected to the first elevated pillar bump and the first chip pad through the opening holes, and the extension portions extend from the via portions onto the encapsulation layer.

According to yet another embodiment, there is provided a method of fabricating a semiconductor package. The method includes providing a first semiconductor chip to which a first elevated pillar bump is connected and stacking a second semiconductor chip on the first semiconductor chip to leave revealed the first elevated pillar bump. The second semiconductor chip has a first chip pad disposed in a center region of the second semiconductor chip, which is spaced apart from an edge region of the second semiconductor chip. A third semiconductor chip is stacked on the second semiconductor chip to be laterally offset from the second semiconductor chip and to leave revealed the first chip pad. An encapsulation layer is formed to encapsulate a stack structure of the first, second, and third semiconductor chips. Circuit interconnection patterns, which are electrically connected to the first elevated pillar bump and the first chip pad, are formed on the encapsulation layer.

DETAILED DESCRIPTION OF THE EMBODIMENTS

Figure 1:
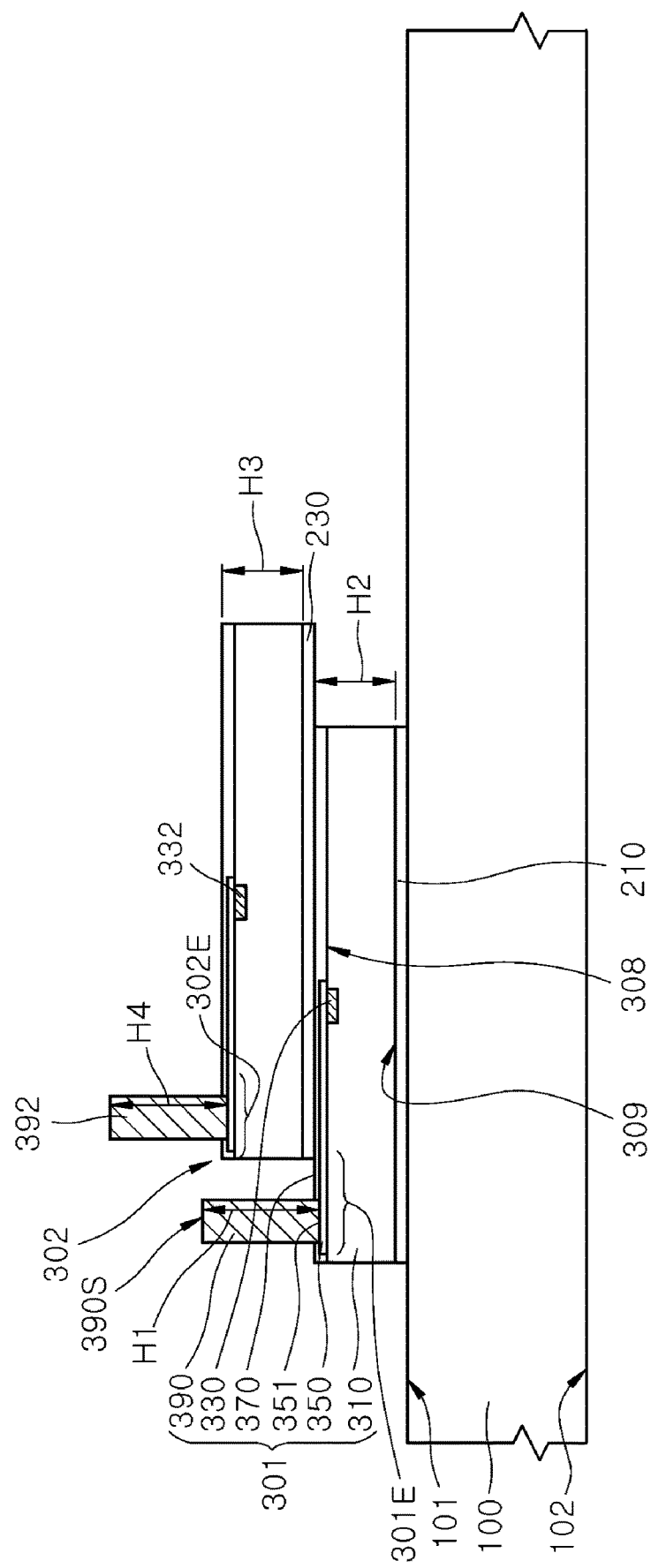
FIGS. 1 to 9 are cross-sectional views illustrating a method of fabricating a semiconductor package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
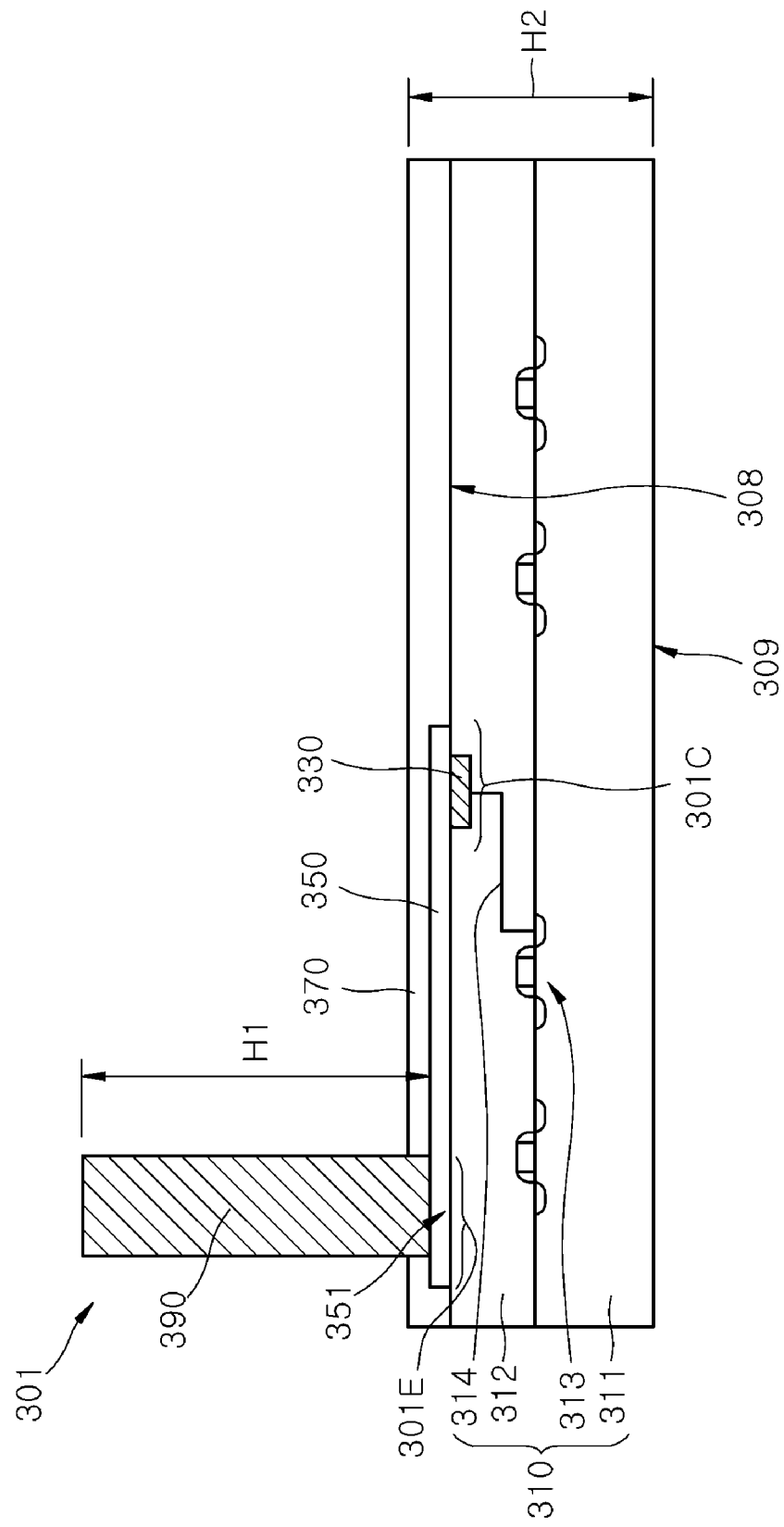

FIG. 1 is a cross-sectional view illustrating a first semiconductor chip 301 and a second semiconductor chip 302 stacked to be offset from the first semiconductor chip 301 on a cover wafer 100. FIG. 2 is a cross-sectional view illustrating the first semiconductor chip 301. In the specification, the terms "first semiconductor chip," "second semiconductor chip," "third semiconductor chip," "fourth semiconductor chip," and the like are only used to distinguish one semiconductor chip from another semiconductor chip, but not used to mean a particular sequence.

Referring to FIG. 1, the cover wafer 100 may be a dummy wafer without any integrated circuits. The dummy wafer used as the cover wafer 100 may be a silicon wafer. The dummy wafer, used as the cover wafer 100, may be a semiconductor wafer, a metal wafer, or a dielectric wafer. The cover wafer 100 may act as a base member supporting the first and second semiconductor chips 301 and 302 stacked on the cover wafer 100. A portion of the cover wafer 100 may be used as a protection member that protects the first and second semiconductor chips 301 and 302 in a semiconductor package.

The first semiconductor chip 301 may be attached to a first surface 101 of the cover wafer 100 using a first adhesive layer 210. The cover wafer 100 may have the first surface 101 and a second surface 102 which are located opposite first semiconductor chip 301. The first adhesive layer 210 may bond a third surface 309 of the first semiconductor chip 301 to the first surface 101 of the cover wafer 100.

The first semiconductor chip 301 may include a chip body 310 providing the third surface 309. The chip body 310 may also provide a fourth surface 308 which is located opposite the cover wafer 100. First chip pads 330 may be exposed at the fourth surface 308 of the chip body 310. Referring to FIG. 2, the chip body 310 may include first integrated circuit elements 313. The first integrated circuit elements 313 may be integrated in or on a first semiconductor layer 311. The first semiconductor layer 311 may be a silicon layer. A first interlayer insulation layer 312 may be disposed on the first semiconductor layer 311 to cover the first integrated circuit elements 313, and a first internal interconnection structure 314 may be disposed in the first interlayer insulation layer 312. The first interlayer insulation layer 312 may include a plurality of dielectric layers which are vertically stacked and may provide the fourth surface 308 of the chip body 310. The first internal interconnection structure 314 may electrically connect the first chip pads 330 to the first integrated circuit elements 313 disposed in the chip body 310.

The first chip pads 330 may correspond to center pads which are located on a surface of a center region 301C of the chip body 310. The center region 301C may be a region which is spaced apart from the first edge regions 301E of the chip body 310. The first semiconductor chip 301 may include redistributed interconnection lines 350 extending from the first chip pads 330 located in the center region 301C toward the first edge region 301E. First elevated pillar bumps 390 may be disposed on and connected to one of the first edge regions 301E. Each of the redistributed interconnection lines 350 may include a connection portion 351, and the first elevated pillar bumps 390 may be disposed on the connection portions 351 of the redistributed interconnection lines 350. The first elevated pillar bumps 390 may be electrically connected to the connection portions 351 of the redistributed interconnection lines 350. A dielectric layer 370 may be formed on the fourth surface 308 of the chip body 310 to cover the redistributed interconnection lines 350. The dielectric layer 370 may be formed to leave open and expose the connection portions 351 of the redistributed interconnection lines 350. The first elevated pillar bumps 390 may be connected to the connection portions 351 which are exposed by the dielectric layer 370.

Referring to FIGS. 1 and 2, the first elevated pillar bumps 390 may act as connection members having a vertical length H1. The length H1 of the first elevated pillar bumps 390 may correspond to a height of the first elevated pillar bumps 390 upwardly protruding from the chip body 310. The first elevated pillar bumps 390 may be provided to substantially heighten a location of the connection portions 351 of the redistributed interconnection lines 350. The first elevated pillar bumps 390 may be formed of a metal material, for example, a copper material. The first elevated pillar bumps 390 may be formed to have the length H1 of approximately several tens of micrometers to approximately one hundred and several tens of micrometers. The length H1 of the first elevated pillar bumps 390 may be substantially equal to a thickness H2 of the first semiconductor chip 301. The length H1 of the first elevated pillar bumps 390 may be greater than the thickness H2 of the first semiconductor chip 301. The thickness H2 of the first semiconductor chip 301 may correspond to a distance between the third surface 309 of the first semiconductor chip 301 and a surface of the dielectric layer 370 opposite the first interlayer insulation layer 312.

Referring again to FIG. 1, the second semiconductor chip 302 may be stacked on the first semiconductor chip 301 to be laterally offset by the first semiconductor chip 301. The second semiconductor chip 302 may be attached to the first semiconductor chip 301 using a second adhesive layer 230. The second semiconductor chip 302 may be a semiconductor chip having substantially the same configuration as the first semiconductor chip 301. For example, the second semiconductor chip 302 may include second chip pads 332 corresponding to center pads and second elevated pillar bumps 392 disposed on a second edge region 302E of the second semiconductor chip 302.

The second semiconductor chip 302 may be laterally offset relative to the first semiconductor chip 301 to leave the first edge region 301E of the first semiconductor chip 301 revealed. Accordingly, the first semiconductor chip 301 and the second semiconductor chip 302 may be vertically stacked on the cover wafer 100 to provide a step structure. The second semiconductor chip 302 may be disposed so that the second edge region 302E is adjacent to the first edge region 301E of the first semiconductor chip 301. Thus, the second elevated pillar bumps 392 may be adjacent to the first elevated pillar bumps 390.

A side surface of the second semiconductor chip 302 may be disposed to face the first elevated pillar bumps 390 in a lateral direction. The first elevated pillar bumps 390 may be laterally spaced apart from the second semiconductor chip 302 by a certain distance. The length H1 of the first elevated pillar bumps 390 may be greater than a vertical thickness H3 of the second semiconductor chip 302. Thus, top surfaces 390S of the first elevated pillar bumps 390 may be located at a level which is higher than a top surface of the second semiconductor chip 302. More specifically, the top surfaces 390S of the first elevated pillar bumps 390 may be located at a level which is higher than the second chip pads 332. The second chip pads 332 may be disposed in a center region of the second semiconductor chip 302.

The second elevated pillar bumps 392 may be formed to have substantially the same shape as the first elevated pillar bumps 390. For example, a vertical length H4 of the second elevated pillar bumps 392 may be substantially equal to the length H1 of the first elevated pillar bumps 390. The length H4 of the second elevated pillar bumps 392 may be greater than the thickness H3 of the second semiconductor chip 302. The length H4 of the second elevated pillar bumps 392 may be greater than the thickness H2 of the first semiconductor chip 301.

In some embodiments, the length H4 of the second elevated pillar bumps 392 may be less than the length H1 of the first elevated pillar bumps 390.

Figure 3:
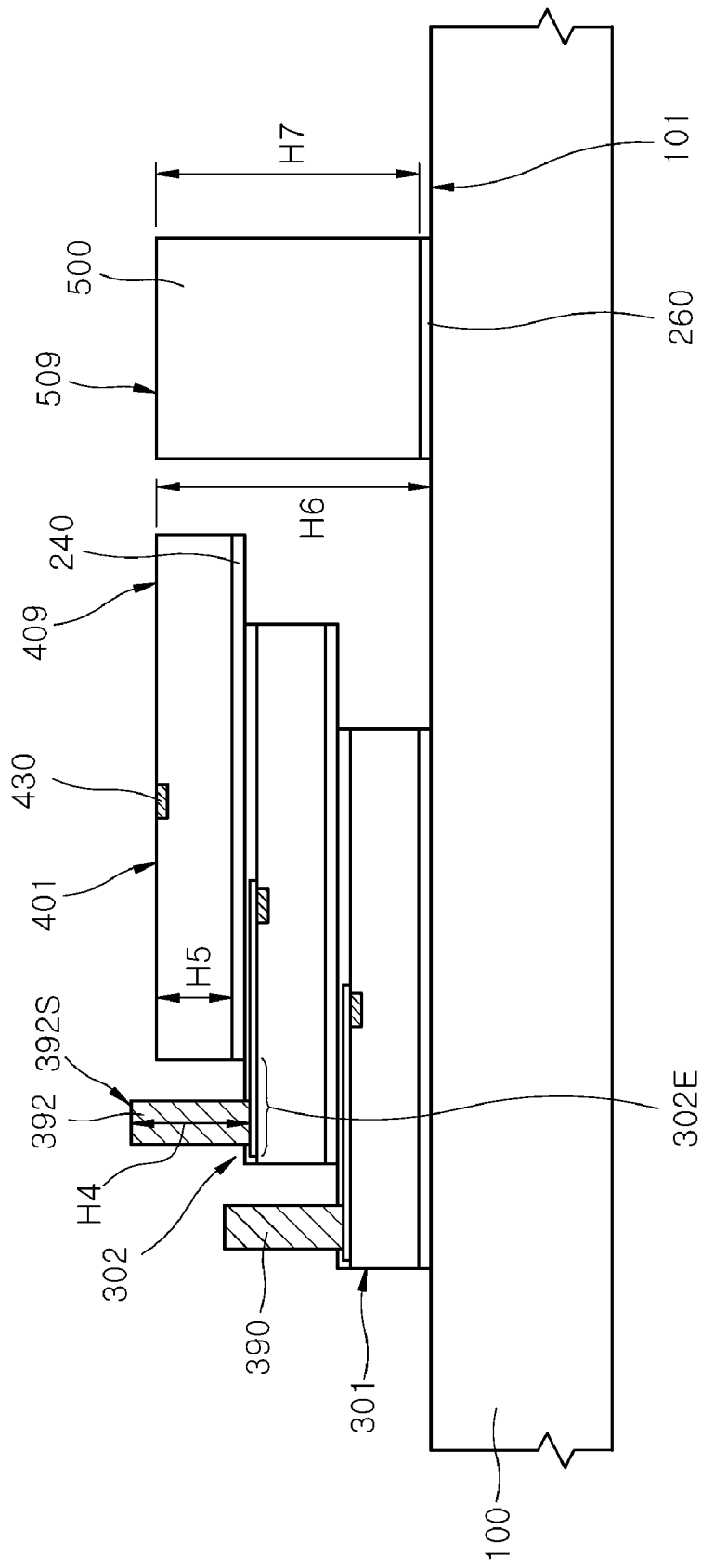
Figure 4:
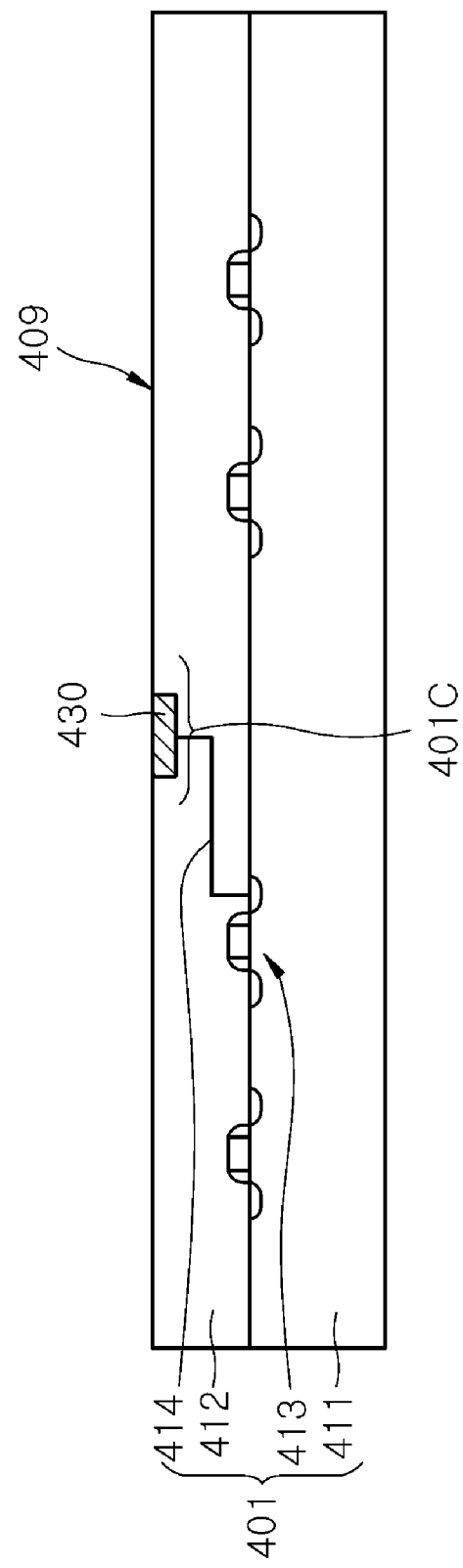

FIG. 3 is a cross-sectional view illustrating a third semiconductor chip 401 stacked on the second semiconductor chip 302 and laterally offset from the second semiconductor chip 302. FIG. 4 is a cross-sectional view illustrating the third semiconductor chip 401.

Referring to FIG. 3, the third semiconductor chip 401 may be laterally offset relative to the second semiconductor chip 302. The third semiconductor chip 401 may be attached to the second semiconductor chip 302 using a third adhesive layer 240. The third semiconductor chip 401 may be laterally offset from the second semiconductor chip 302 to leave the second edge region 302E of the second semiconductor chip 302 revealed. The second semiconductor chip 302 and the third semiconductor chip 401 may be vertically stacked on the first semiconductor chip 301 provide a step structure. Thus, the third semiconductor chip 401 may be disposed on the second semiconductor chip 302 such that a side surface of the second semiconductor chip 302 may face the second elevated pillar bumps 392 in a lateral direction. The length H4 of the second elevated pillar bumps 392 may be greater than a vertical thickness H5 of the third semiconductor chip 401. Thus, top surfaces 392S of the second elevated pillar bumps 392 may be located at a level which is higher than a fifth surface 409 of the third semiconductor chip 401 opposite the second semiconductor chip 302. In some embodiments, the second elevated pillar bumps 392 may upwardly protrude from the second semiconductor chip 302 to have a vertical length H4 substantially equal to a thickness of the third semiconductor chip 401.

Referring to FIGS. 3 and 4, the third semiconductor chip 401 may be configured without any elevated pillar bumps unlike the first and second semiconductor chips 301 and 302. The third semiconductor chip 401 may include third chip pads 430 which remain exposed on the fifth surface 409 corresponding to a top surface of the third semiconductor chip 401. The third semiconductor chip 401 may include second integrated circuit elements 413. The second integrated circuit elements 413 may be integrated in or on a second semiconductor layer 411. The second semiconductor layer 411 may be a silicon layer. A second interlayer insulation layer 412 may be disposed on the second semiconductor layer 411 to cover the second integrated circuit elements 413, and a second internal interconnection structure 414 may be disposed in the second interlayer insulation layer 412. The second interlayer insulation layer 412 may include a plurality of dielectric layers which are vertically stacked and may provide the fifth surface 409. The second internal interconnection structure 414 may electrically connect the third chip pads 430 to the second integrated circuit elements 413 disposed in the third semiconductor chip 401.

The second integrated circuit elements 413 may include cell transistors constituting a memory device. The first integrated circuit elements (313 of FIG. 2) may also include cell transistors constituting a memory device. The third semiconductor chip 401 may be a memory chip, and the first and second semiconductor chips 301 and 302 may also be memory chips.

The third chip pads 430 may correspond to center pads which are located in a center region 401C of the third semiconductor chip 401. The third semiconductor chip 401 may be configured not to include any redistributed interconnection lines and any dielectric layer covering the redistributed interconnection lines, unlike the first and second semiconductor chips 301 and 302.

Referring again to FIG. 3, a chip supporter 500 may be disposed on the cover wafer 100 to be spaced apart from the third semiconductor chip 401. The chip supporter 500 may be attached to the first surface 101 of the cover wafer 100 using a fourth adhesive layer 260. The cover wafer 100 may support the chip supporter 500. The chip supporter 500 may be provided to have a vertical thickness H7 which is substantially equal to a total height H6 of the first, second, and third semiconductor chips 301, 302, and 401. For example, the thickness H7 of the chip supporter 500 may correspond to a value that remains after subtracting a thickness of the fourth adhesive layer 260 from the total height H6 of the first, second, and third semiconductor chips 301, 302, and 401. Thus, a top surface 509 of the chip supporter 500 may be located at substantially the same level as the fifth surface 409 that corresponds to a top surface of the third semiconductor chip 401.

Figure 5:
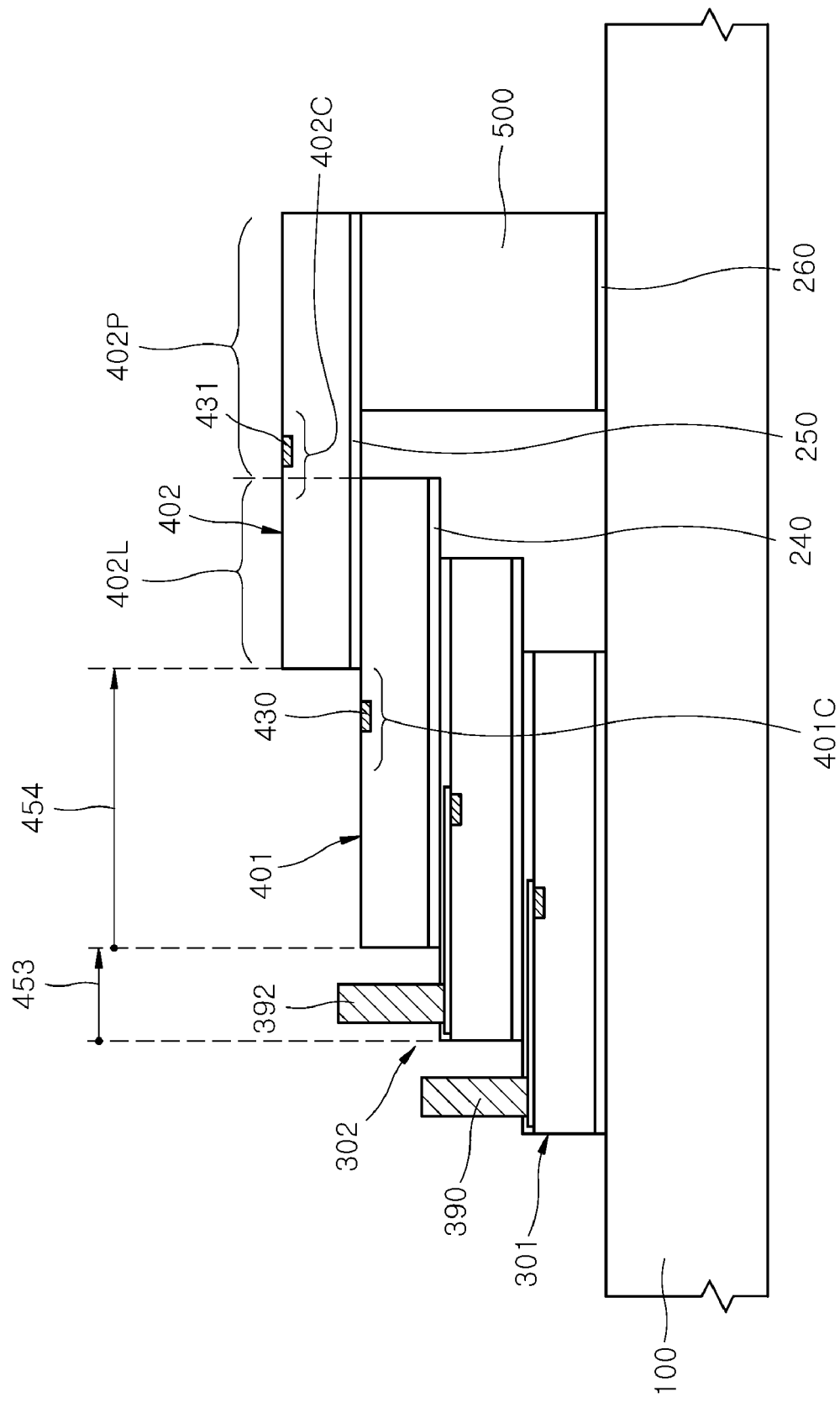

FIG. 5 is a cross-sectional view illustrating a fourth semiconductor chip 402 stacked to be laterally offset on the third semiconductor chip 401.

Referring to FIG. 5, the fourth semiconductor chip 402 may be stacked to be laterally offset by the third semiconductor chip 401. The second, third, and fourth semiconductor chips 302, 401, and 402 may be sequentially stacked on the first semiconductor chip 301 to be offset relative to the first semiconductor chip 301 in substantially the same offset direction. An offset distance 454 of the fourth semiconductor chip 402 relative to the third semiconductor chip 401 may be greater than an offset distance 453 of the third semiconductor chip 401 relative to the second semiconductor chip 302.

The center region 401C where the third chip pads 430 are located may remain uncovered by the fourth semiconductor chip 402. The center region 401C of the third semiconductor chip 401 may be spaced apart from an edge region of the third semiconductor chip 401. The fourth semiconductor chip 402 may be offset such that the third chip pads 430 of the third semiconductor chip 401 remain exposed, and the fourth semiconductor chip 402 may partially overlap with the third semiconductor chip 401. Thus, a portion of the fourth semiconductor chip 402 may laterally protrude beyond a side surface of the third semiconductor chip 401 to provide an overhang 402P. A width of the overhang 402P of the fourth semiconductor chip 402 may be greater than a width of an overlap portion 402L of the fourth semiconductor chip 402, which overlaps the third semiconductor chip 401.

The chip supporter 500 may support the overhang 402P of the fourth semiconductor chip 402. The chip supporter 500 may prevent the overhang 402P of the fourth semiconductor chip 402 from warping downwardly. That is, the chip supporter 500 may prevent warpage or deformation of the overhang 402P of the fourth semiconductor chip 402 to prevent cracks from forming in the fourth semiconductor chip 402. The fourth semiconductor chip 402 may be attached to both the third semiconductor chip 401 and the chip supporter 500 using a fifth adhesive layer 250.

The chip supporter 500 may be a dummy die. The chip supporter 500 may be provided to have the same material as the fourth semiconductor chip 402. For example, the chip supporter 500 may be a silicon die. The chip supporter 500 may have a width which is half a width of the fourth semiconductor chip 402. Alternatively, the width of the chip supporter 500 may be less than half the width of the fourth semiconductor chip 402.

The fourth semiconductor chip 402 may be a semiconductor chip having substantially the same function and shape as the third semiconductor chip 401. The fourth semiconductor chip 402 may be provided to have a center region 402C and fourth chip pads 431 disposed on the center region 402C.

Figure 6:
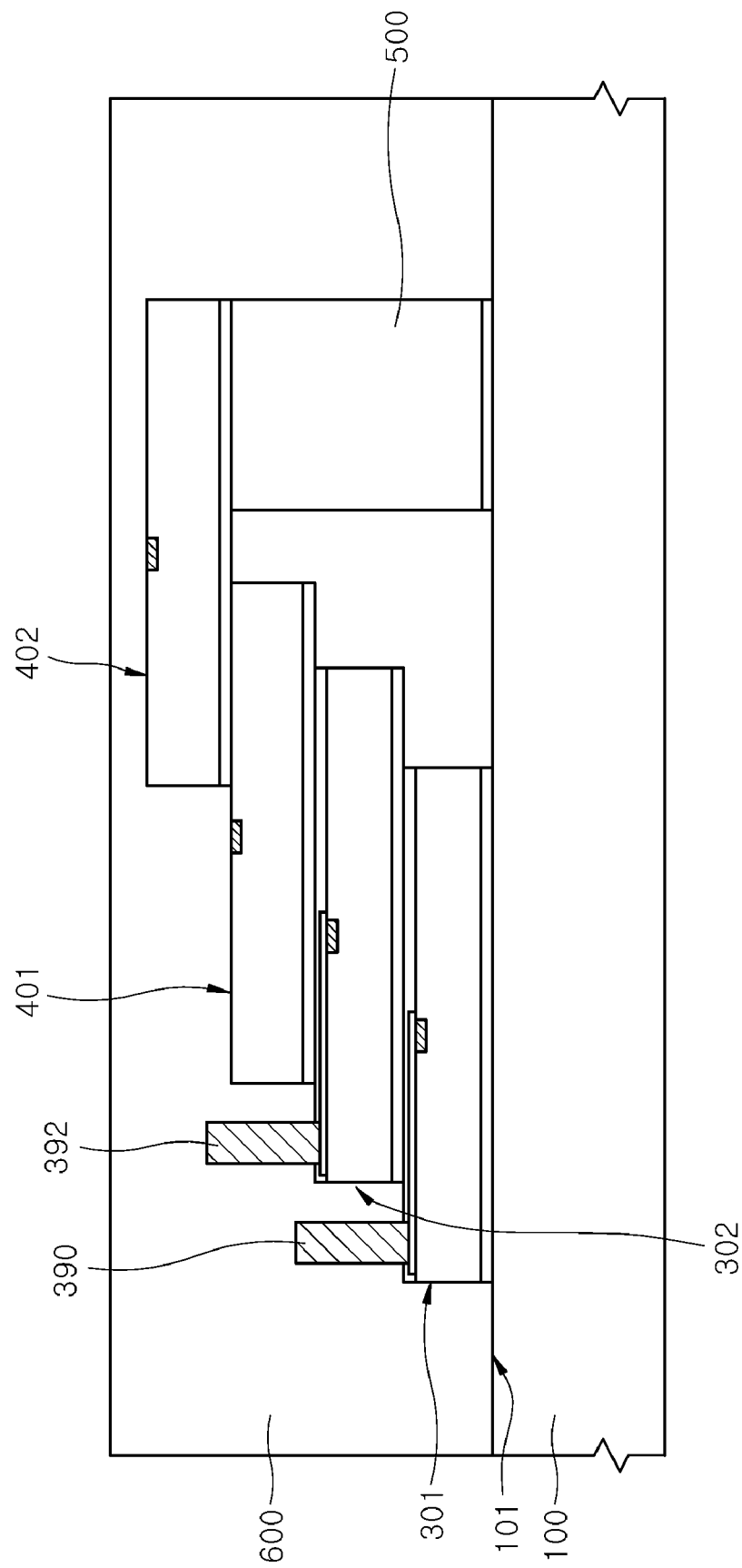

FIG. 6 is a cross-sectional view illustrating a photosensitive material layer 600 that encapsulates the first, second, third, and fourth semiconductor chips 301, 302, 401, and 402.

Referring to FIG. 6, the photosensitive material layer 600 may be formed on the first surface 101 of the cover wafer 100 to cover the first, second, third, and fourth semiconductor chips 301, 302, 401, and 402. The photosensitive material layer 600 may be formed by laminating a photosensitive dielectric film on the first surface 101 of the cover wafer 100. The photosensitive material layer 600 may act as an encapsulation layer that covers, encapsulates, and protects the first, second, third, and fourth semiconductor chips 301, 302, 401, and 402.

The photosensitive material layer 600 may include a photosensitive polymer material such as a photosensitive polyimide material or a photosensitive polybenzoxazole material. Because the photosensitive material layer 600 includes a photosensitizer, a solubility of the photosensitive material layer 600 may depend on an exposure process applied to the photosensitive material layer 600. For example, a solubility of the photosensitive material layer 600 exposed to a light such as an ultraviolet (UV) ray may be different from a solubility of the photosensitive material layer 600 not exposed to a light such as an ultraviolet (UV) ray.

Figure 7:
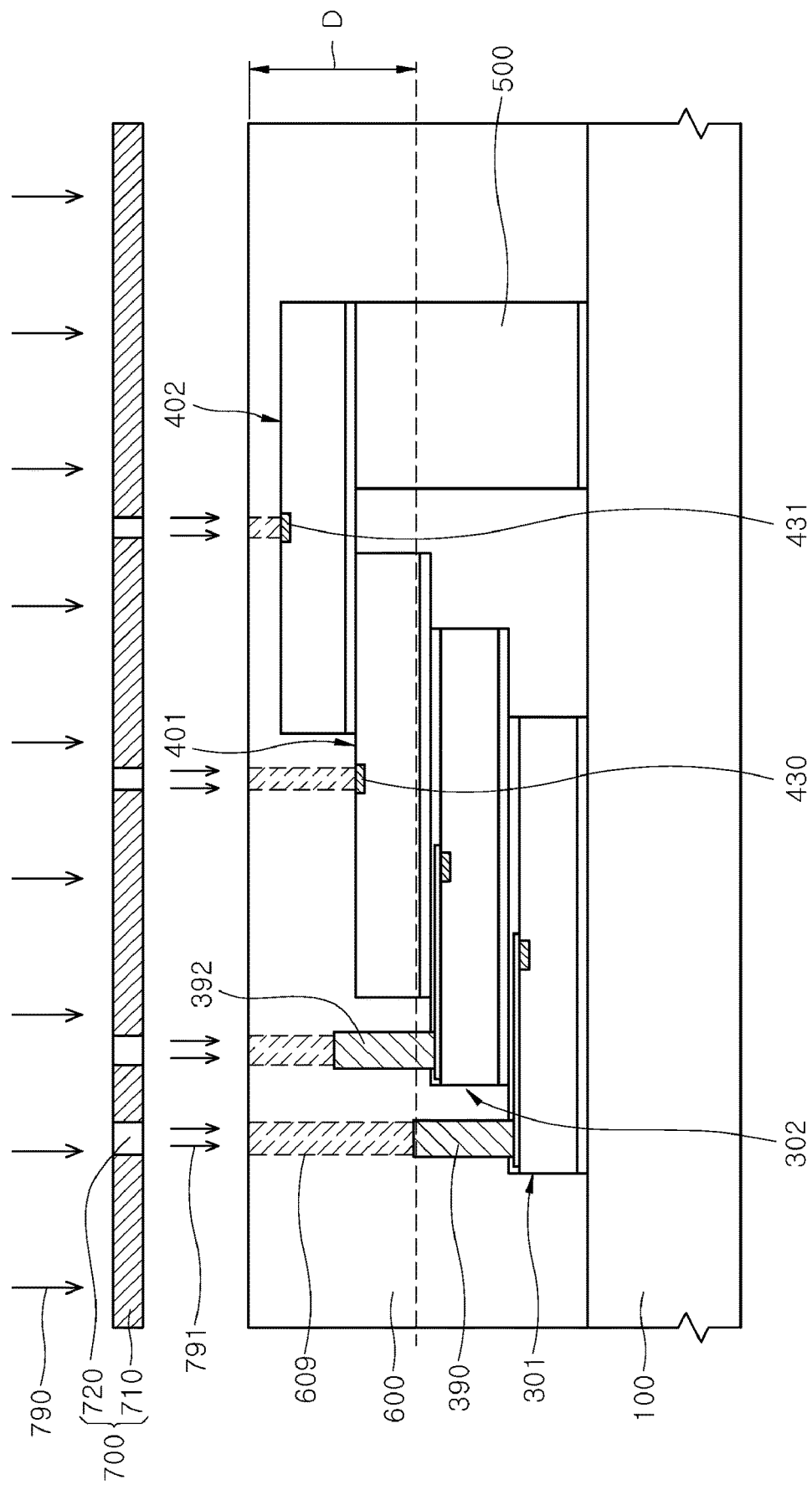

FIG. 7 is a cross-sectional view illustrating a step of partially exposing the photosensitive material layer 600.

Referring to FIG. 7, some portions of the photosensitive material layer 600 may be selectively exposed to a light using a photolithography apparatus. Specifically, a photomask 700 may be located over the photosensitive material layer 600, and an exposure light 790 may be irradiated onto the photomask 700. A portion of the exposure light 790 may be blocked by light blocking regions 710 of the photomask 700, and the remaining portion 791 of the exposure light 790 may pass through light permeation regions 720 of the photomask 700 to reach predetermined portions of the photosensitive material layer 600. Thus, the exposure light 790 may change a chemical property of the predetermined portions of the photosensitive material layer 600 and may change a solubility of the predetermined portions of the photosensitive material layer 600.

The exposure light 790 may infiltrate into the photosensitive material layer 600 to form exposed regions 609 of the photosensitive material layer 600. The exposed regions 609 may correspond to regions which are aligned to overlap with the first and second elevated pillar bumps 390 and 392 and the third and fourth chip pads 430 and 431. An exposure critical depth D that the exposure light 790 is able to effectively travel into the photosensitive material layer 600 may be limited to a certain depth. The exposure critical depth D indicates an effective depth of the photosensitive material layer 600 which is normally exposed by the exposure light 790. That is, the exposure light 790 being intense enough to normally expose the photosensitive material layer 600 may not reach a portion of the photosensitive material layer 600, which is lower than the exposure critical depth D. Accordingly, the exposed regions 609 should not be formed deeper than the exposure critical depth D.

In the present disclosure, the first and second elevated pillar bumps 390 and 392 may be formed so that top surfaces of the first and second elevated pillar bumps 390 and 392 are located within a range of the exposure critical depth D. Thus, the exposed regions 609 may be formed to contact the top surfaces of the first and second elevated pillar bumps 390 and 392.

Figure 8:
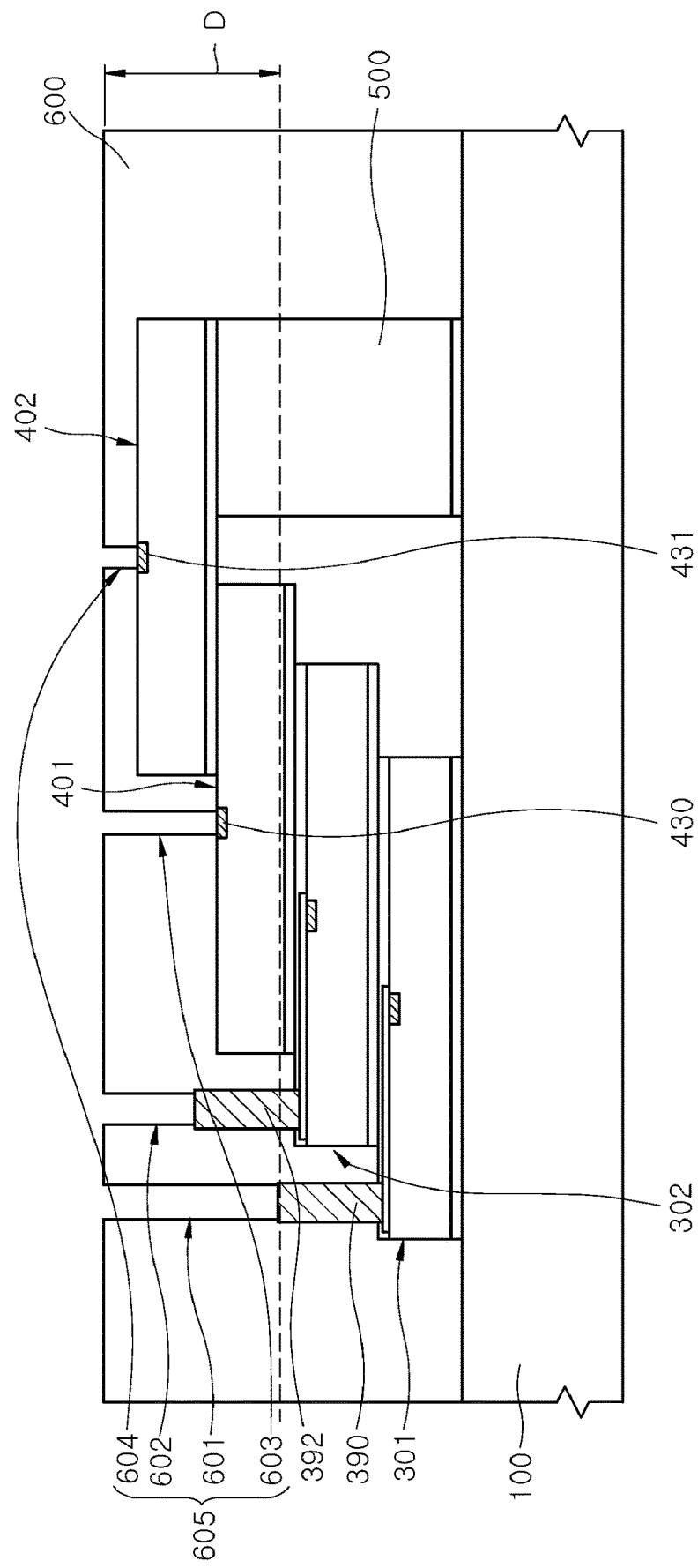

FIG. 8 is a cross-sectional view illustrating a step of forming opening holes 605 in the photosensitive material layer 600.

Referring to FIG. 8, the exposed regions (609 of FIG. 7) may be selectively removed by developing the photosensitive material layer 600. As a result, the opening holes 605 which substantially penetrate the photosensitive material layer 600 may be formed. The opening holes 605 may be formed using a single exposure step and a single development step. The opening holes 605 may include first to fourth opening holes 601, 602, 603, and 604. The first opening holes 601 may be aligned with the first elevated pillar bumps 390 and may be formed to expose top surfaces of the first elevated pillar bumps 390. The second opening holes 602 may be aligned with the second elevated pillar bumps 392 and may be formed to expose top surfaces of the second elevated pillar bumps 392. The third opening holes 603 may be aligned with the third chip pads 430 and may be formed to expose top surfaces of the third chip pads 430. The fourth opening holes 604 may be aligned with the fourth chip pads 431 and may be formed to expose top surfaces of the fourth chip pads 431. Even though the opening holes 605 are formed at different positions and are formed to have different depths, all of the opening holes 605 may be simultaneously formed using a single lithography step including a single exposure step and a single development step.

Referring to FIGS. 7 and 8, the first and second semiconductor chips 301 and 302 may be located out of the range of the exposure critical depth D. Thus, it may be difficult to form the exposed regions 609 directly extending to surfaces of the first and second semiconductor chips 301 and 302. That is, it may be difficult to form the first and second opening holes 601 and 602 that directly expose surfaces of the first and second semiconductor chips 301 and 302. At least top surfaces of the first and second elevated pillar bumps 390 and 392 may be directly exposed by the first and second opening holes 601 and 602 because the first and second elevated pillar bumps 390 and 392 extend upwardly so that the top surfaces of the first and second elevated pillar bumps 390 and 392 are located within range of the exposure critical depth D. Accordingly, the first and second elevated pillar bumps 390 and 392 may act as connectors that connect the first and second semiconductor chips 301 and 302 to the first and second opening holes 601 and 602.

The fourth chip pads 431 may be spaced apart from the third chip pads 430 by the offset distance (454 of FIG. 5). Thus, the fourth opening holes 604 may also be spaced apart from the third opening holes 603 by the offset distance (454 of FIG. 5). The third chip pads 430 may be spaced apart from the second elevated pillar bumps 392 by at least half a width of the third semiconductor chip 401. Thus, the third opening holes 603 may also be spaced apart from the second opening holes 602 by at least half a width of the third semiconductor chip 401. As such, because the second, third, and fourth opening holes 602, 603, and 604 are spaced apart from each other by a relatively long distance, it may be possible to prevent the second, third, and fourth opening holes 602, 603, and 604 from being connected to each other.

Figure 9:
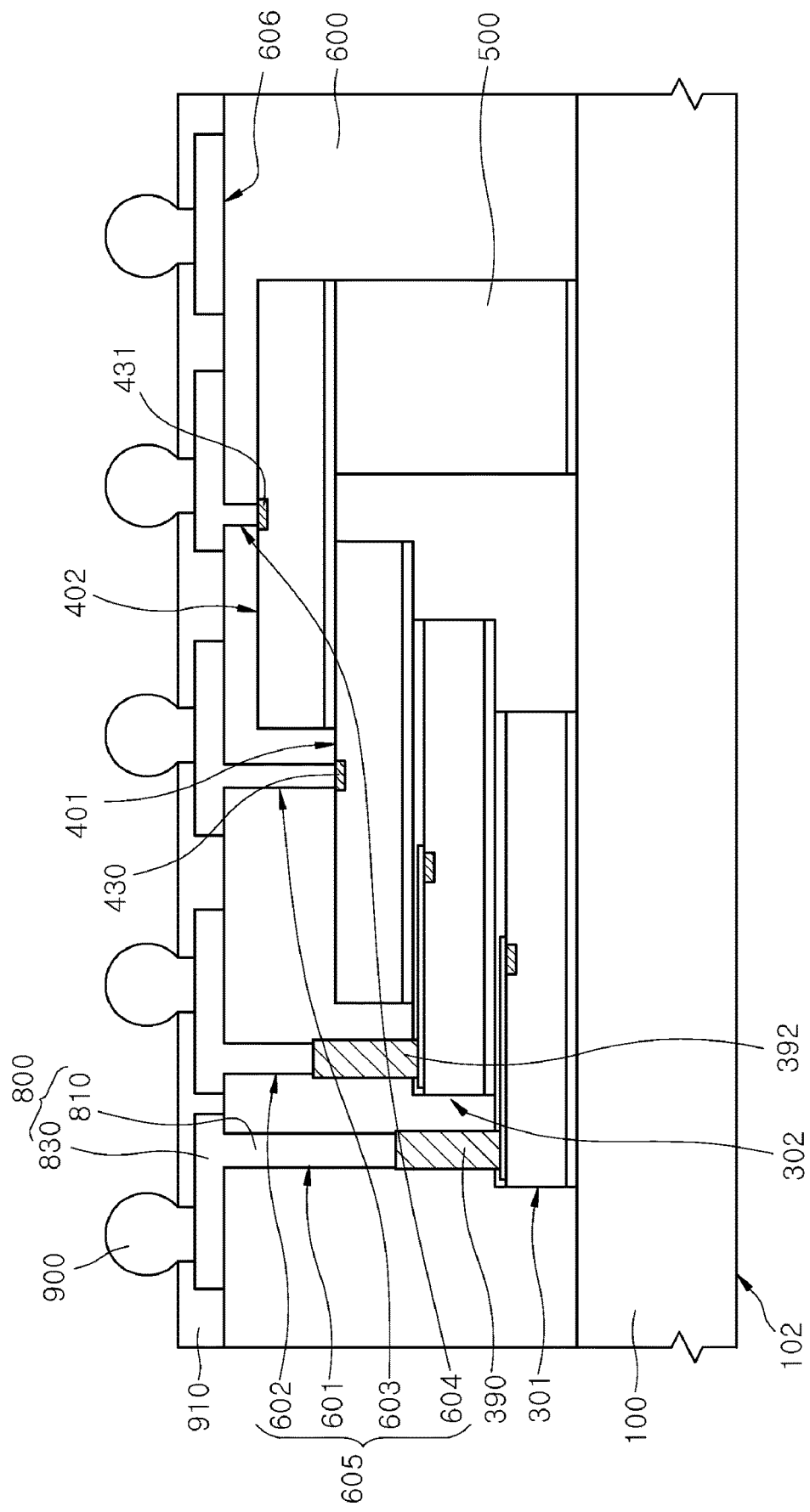

FIG. 9 is a cross-sectional view illustrating a step of forming circuit interconnection patterns 800.

Referring to FIG. 9, the circuit interconnection patterns 800 may be formed on the photosensitive material layer 600. Each of the circuit interconnection patterns 800 may be formed to include a via portion 810 filling any one of the opening holes 605, and an extension portion 830 extending from the via portion 810 onto a surface 606 of the photosensitive material layer 600. The via portions 810 of the circuit interconnection patterns 800 may directly contact the first and second elevated pillar bumps 390 and 392 and the third and fourth chip pads 430 and 431, respectively. The via portions 810 of the circuit interconnection patterns 800 may be directly connected to the first and second elevated pillar bumps 390 and 392 and the third and fourth chip pads 430 and 431, respectively. The via portions 810 of the circuit interconnection patterns 800 may be directly and respectively connected to the first and second elevated pillar bumps 390 and 392 and the third and fourth chip pads 430 and 431 through the opening holes 605.

Because the first opening holes 601 may be extend deeper than a lower portion of the third semiconductor chip 401, a vertical length of the via portions 810 filling the first opening holes 601 may be greater than a thickness of the third semiconductor chip 401. Because the third opening holes 603 may be formed deeper than a lower portion of the fourth semiconductor chip 402, a vertical length of the via portions 810 filling the third opening holes 603 may be greater than a thickness of the fourth semiconductor chip 402. In contrast, because the fourth opening holes 604 are formed shallower than a thickness of the fourth semiconductor chip 402, a vertical length of the via portions 810 filling the fourth opening holes 604 may be less than a thickness of the fourth semiconductor chip 402.

A dielectric layer 910 may be formed on the surface 606 of the photosensitive material layer 600 to leave portions of the extension portions 830 of the circuit interconnection patterns 800 revealed. Outer connectors 900 may be formed on the portions of the extension portions 830 of the circuit interconnection patterns 800 which remain revealed. The outer connectors 900 may be formed of bumps or solder balls. In such a case, some of the extension portions 830 may be formed to extend onto an edge region of the photosensitive material layer 600 to not overlap with the first to fourth semiconductor chips 301, 302, 401, and 402. Accordingly, some of the outer connectors 900 may be formed to not overlap with the first to fourth semiconductor chips 301, 302, 401, and 402.

Figure 10:
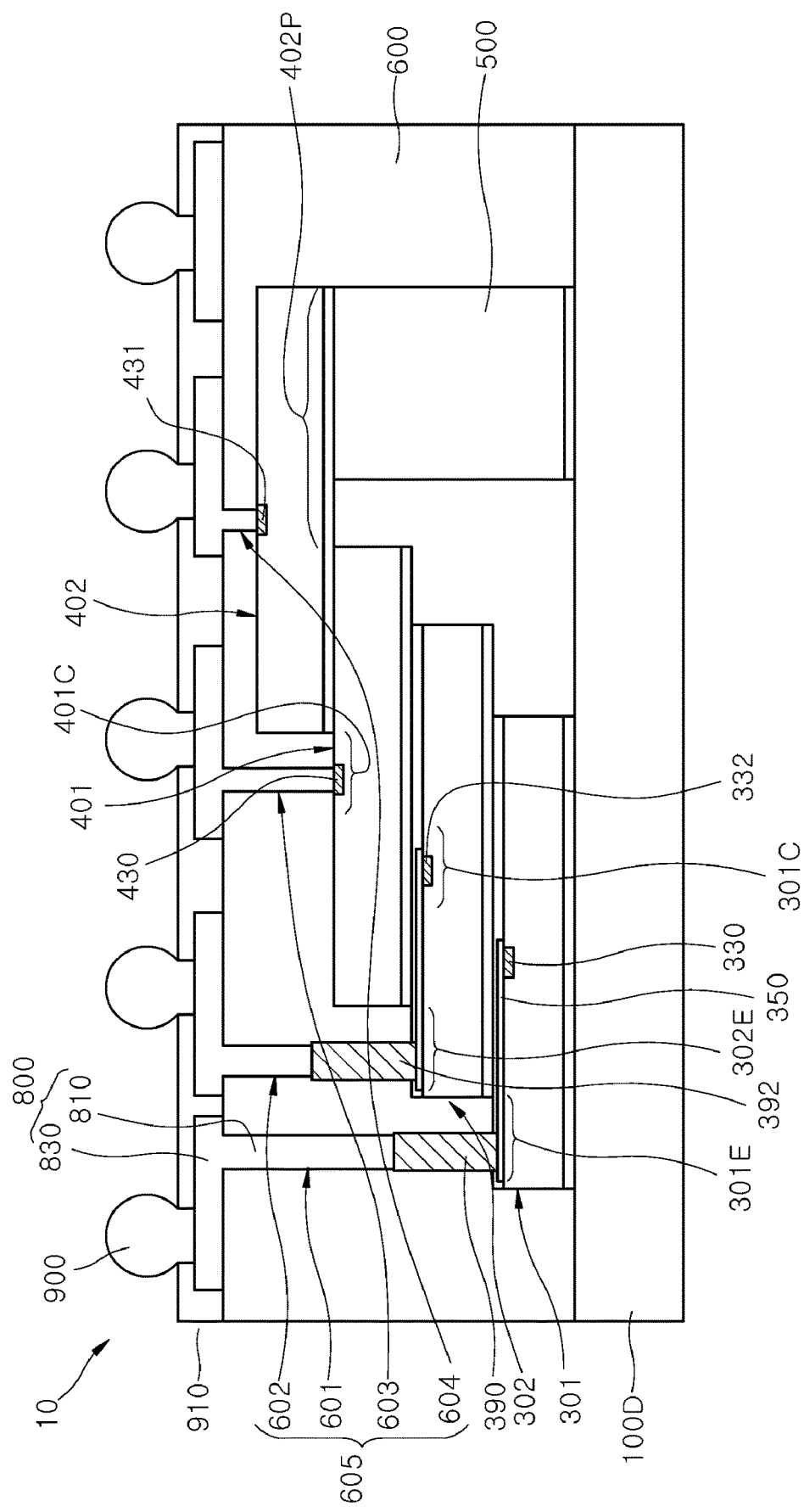
FIG. 10 is a cross-sectional view illustrating a semiconductor package according to an embodiment.

The cover wafer 100 on which the outer connectors 900 may be cut using a singulation process such as a die sawing process to provide a plurality of discrete semiconductor packages 10, one of which is illustrated in FIG. 10. Before the singulation process is performed, a recession process may be applied to the second surface 102 of the cover wafer 100 to reduce a thickness of the cover wafer 100.

Referring to FIG. 10, the discrete semiconductor package 10 may include the first to fourth semiconductor chips 301, 302, 401, and 402 which are stacked on any one of a plurality of cover dies 100D produced by cutting the cover wafer 100. The cover die 100D may be a silicon die. The chip supporter 500 may be supported by the cover die 100D. The first elevated pillar bumps 390 may be disposed on the first edge region 301E of the first semiconductor chip 301, and the second elevated pillar bumps 392 may be disposed on the second edge region 302E of the second semiconductor chip 302. The overhang 402P of the fourth semiconductor chip 402 may be supported by the chip supporter 500.

A stack of the first to fourth semiconductor chips 301, 302, 401, and 402 may be covered and encapsulated by the photosensitive material layer 600. The opening holes 605 may be formed to substantially penetrate the photosensitive material layer 600 using a single photolithography step including a single exposure step and a single development step. The opening holes 605 may be filled with the via portions 810, and the via portions 810 may extend onto the photosensitive material layer 600 to provide the extension portions 830. The via portions 810 and the extension portions 830 may constitute the circuit interconnection patterns 800. The circuit interconnection patterns 800 may be disposed on the photosensitive material layer 600 acting as an encapsulation layer and may be electrically connected to the first and second elevated pillar bumps 390 and 392 and the third and fourth chip pads 430 and 431. The dielectric layer 910 may be disposed on the circuit interconnection patterns 800 to leave portions of the circuit interconnection patterns 800 revealed, and the outer connectors 900 may be attached and connected to the revealed portions of the circuit interconnection patterns 800.

Figure 11:
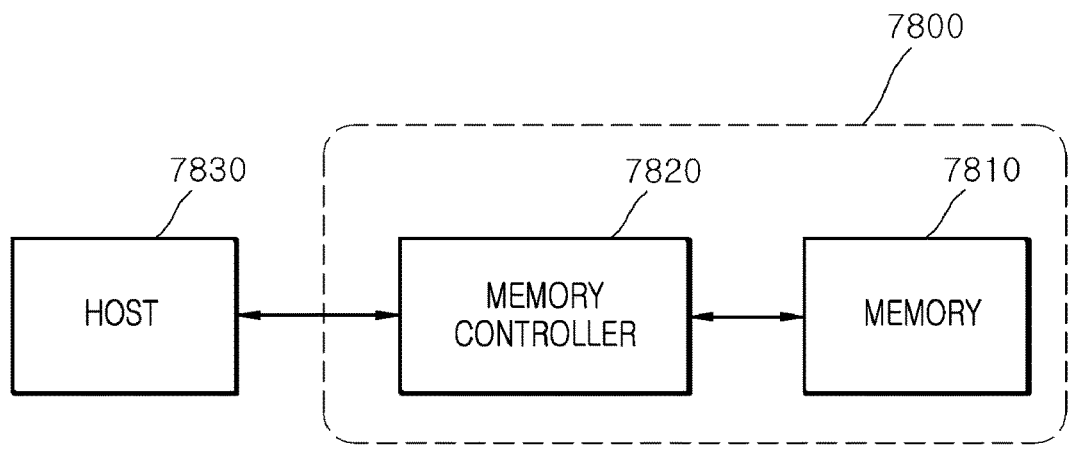
FIG. 11 is a block diagram illustrating an electronic system employing a memory card including a semiconductor package according to an embodiment.

FIG. 11 is a block diagram illustrating an electronic system including a memory card 7800 employing the semiconductor package according to an embodiment. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include the semiconductor package according to an embodiment.

The memory 7810 may include a nonvolatile memory device to which the technology of the embodiment of the present disclosure is applied. The memory controller 7820 may control the memory 7810 such that stored data is read out or data is stored in response to a read/write request from a host 7830.

Figure 12:
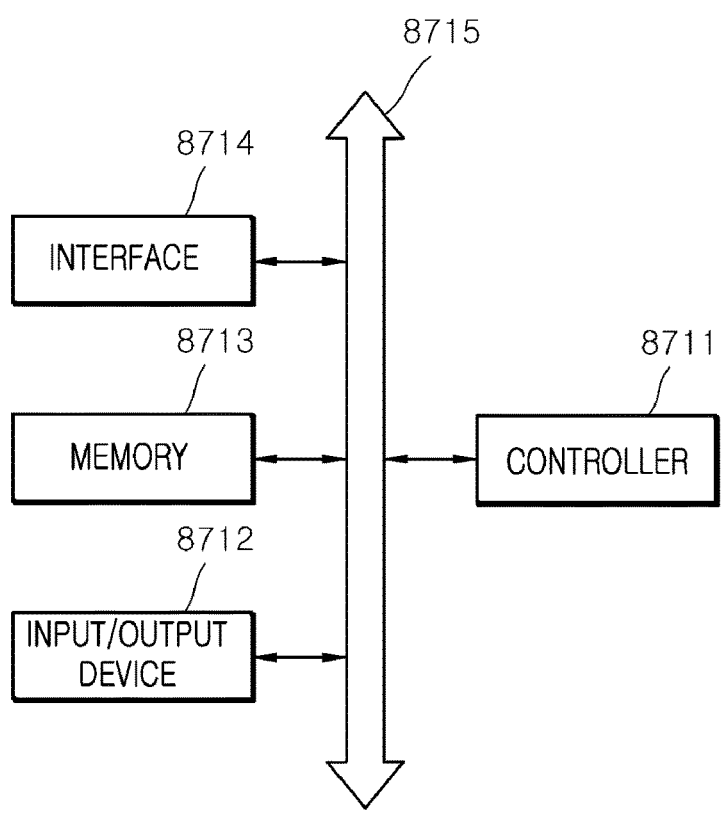
FIG. 12 is a block diagram illustrating another electronic system including a semiconductor package according to an embodiment.

FIG. 12 is a block diagram illustrating an electronic system 8710 including the semiconductor packages according to an embodiment. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to an embodiment of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution), or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
    a first semiconductor chip to which a first elevated pillar bump is connected;
    a second semiconductor chip stacked on the first semiconductor chip to leave revealed the first elevated pillar bump and configured to include a first chip pad disposed in a center region of the second semiconductor chip, wherein the center region of the second semiconductor chip is spaced apart from an edge region of the second semiconductor chip;
    a third semiconductor chip stacked on the second semiconductor chip to be laterally offset from the second semiconductor chip to leave revealed the first chip pad and configured to include an overhang laterally protruding further than a side surface of the second semiconductor chip;
    a chip supporter supporting the overhang of the third semiconductor chip;
    an encapsulation layer encapsulating a stack structure of the first, second, and third semiconductor chips; and
    circuit interconnection patterns disposed on the encapsulation layer and electrically connected to the first elevated pillar bump and the first chip pad.

2. The semiconductor package of claim 1,
    wherein the encapsulation layer includes opening holes that respectively expose the first elevated pillar bump and the first chip pad; and
    wherein each of the circuit interconnection patterns fills any one of the opening holes and extends onto the encapsulation layer.

3. The semiconductor package of claim 1, wherein the encapsulation layer includes a photosensitive material layer.

4. The semiconductor package of claim 1, wherein the first elevated pillar bump is connected to an edge region of the first semiconductor chip.

5. The semiconductor package of claim 4, wherein the first semiconductor chip includes:
    a second chip pad disposed in a center region of the first semiconductor chip, wherein the center region of the first semiconductor chip is spaced apart from an edge region of the first semiconductor chip; and
    a redistributed interconnection line extending from the second chip pad to contact the first elevated pillar bump.

6. The semiconductor package of claim 1, wherein the first elevated pillar bump upwardly protrudes from the first semiconductor chip to have a vertical length which is substantially equal to a thickness of the second semiconductor chip.

7. The semiconductor package of claim 1, wherein the first elevated pillar bump upwardly protrudes from the first semiconductor chip to have a vertical length which is greater than a thickness of the second semiconductor chip.

8. The semiconductor package of claim 1, wherein the second semiconductor chip is stacked on the first semiconductor chip to provide a step structure.

9. The semiconductor package of claim 1, further comprising a fourth semiconductor chip stacked on a bottom surface of the first semiconductor chip opposite to the second semiconductor chip,
    wherein a second elevated pillar bump is connected to the fourth semiconductor chip; and wherein the first semiconductor chip is offset-stacked on the fourth semiconductor chip to leave revealed the second elevated pillar bump.

10. The semiconductor package of claim 9, further comprising a cover die supporting the fourth semiconductor chip.

11. The semiconductor package of claim 10, wherein the chip supporter is supported by the cover die.

12. The semiconductor package of claim 11, wherein the chip supporter is disposed on the cover die to have a height which is substantially equal to a total height of the fourth, first and second semiconductor chips.

13. The semiconductor package of claim 12, wherein the chip supporter is a silicon die.

14. The semiconductor package of claim 9, wherein an offset distance of the third semiconductor chip relative to the second semiconductor chip is greater than an offset distance of the first semiconductor chip relative to the fourth semiconductor chip.

15. The semiconductor package of claim 9, wherein the first, second, third and fourth semiconductor chips are offset-stacked in substantially the same offset direction.

16. The semiconductor package of claim 9,
wherein the first and fourth semiconductor chips have substantially the same shape; and
wherein the second and third semiconductor chips have substantially the same shape.

17. A semiconductor package comprising:
a first semiconductor chip to which a first elevated pillar bump is connected;
a second semiconductor chip stacked on the first semiconductor chip to leave revealed the first elevated pillar bump and configured to include a first chip pad;
an encapsulation layer encapsulating a stack structure of the first and second semiconductor chips;
opening holes substantially penetrating the encapsulation layer to expose the first elevated pillar bump and the first chip pad; and
circuit interconnection patterns configured to include via portions connected to the first elevated pillar bump and the first chip pad through the opening holes and extension portions extending from the via portions onto the encapsulation layer,
wherein the first elevated pillar bump upwardly protrudes from the first semiconductor chip to have a vertical length which is substantially equal to or greater than a thickness of the second semiconductor chip.

18. The semiconductor package of claim 17, wherein the via portions directly contact the first elevated pillar bump and the first chip pad, respectively.

19. The semiconductor package of claim 17, wherein the first chip pad is disposed in a center region of the second semiconductor chip, which is spaced apart from an edge region of the second semiconductor chip.

20. The semiconductor package of claim 19, further comprising a third semiconductor chip offset-stacked on the second semiconductor chip to leave revealed the first chip pad,
wherein the third semiconductor chip has an overhang laterally protruding from a side surface of the second semiconductor chip.

* * * * *